(12) United States Patent
Yang et al.

(10) Patent No.: US 11,106,965 B2
(45) Date of Patent: Aug. 31, 2021

(54) RADIO FREQUENCY IDENTIFICATION TAG AND MANUFACTURING METHOD THEREOF

(71) Applicant: ELECTRONICS AND TELECOMMUNICATIONS RESEARCH INSTITUTE, Daejeon (KR)

(72) Inventors: Yong Suk Yang, Daejeon (KR); Sunghoon Hong, Daejeon (KR); Woo Seok Yang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/926,630

(22) Filed: Jul. 10, 2020

(65) Prior Publication Data

US 2021/0064952 A1 Mar. 4, 2021

(30) Foreign Application Priority Data

Aug. 28, 2019 (KR) .................. 10-2019-0106011
Dec. 10, 2019 (KR) .................. 10-2019-0163803

(51) Int. Cl.
*G06K 19/077* (2006.01)
*G06K 7/10* (2006.01)
*H05K 1/16* (2006.01)
*H01Q 1/22* (2006.01)

(52) U.S. Cl.
CPC ... *G06K 19/07794* (2013.01); *G06K 7/10366* (2013.01); *H01Q 1/2208* (2013.01); *H05K 1/16* (2013.01)

(58) Field of Classification Search
CPC ........ G06K 19/00; G06K 19/04; G06K 19/06; G06K 19/07; G06K 19/067; G06K 19/07794; G06K 7/10366
USPC ................................ 235/492, 487, 380, 375
See application file for complete search history.

(56) References Cited

U.S. PATENT DOCUMENTS

| | | | |
|---|---|---|---|
| 8,022,791 B2 | 9/2011 | Ju et al. | |
| 8,314,963 B2 | 11/2012 | Park | |
| 8,786,441 B2 | 7/2014 | Yang et al. | |
| 2008/0272893 A1* | 11/2008 | Hilgers | G06K 19/0717 340/10.5 |
| 2010/0073137 A1* | 3/2010 | Kobayashi | H04L 27/04 340/10.1 |
| 2013/0057390 A1 | 3/2013 | Watt et al. | |

(Continued)

FOREIGN PATENT DOCUMENTS

| KR | 100979992 B1 | 9/2010 |
|---|---|---|
| KR | 101123200 B1 | 3/2012 |
| KR | 101427657 B1 | 8/2014 |

*Primary Examiner* — Edwyn Labaze
(74) *Attorney, Agent, or Firm* — Rabin & Berdo, P.C.

(57) ABSTRACT

Provided are a radio frequency identification tag and a method of manufacturing the same. The radio frequency identification tag includes a substrate, an antenna unit provided on the substrate and configured to transmit and receive signals, an integrated circuit unit spaced apart from the antenna unit on the substrate, and an interrupter and a delay circuit unit connected in parallel between the antenna unit and the integrated circuit unit, wherein the interrupter includes a variable portion and a fixed portion opposite the variable portion, wherein the delay circuit unit includes a capacitor and a resistor.

20 Claims, 9 Drawing Sheets

(56) References Cited

U.S. PATENT DOCUMENTS

2014/0361089 A1\* 12/2014 Kai ................. G06K 19/07786
　　　　　　　　　　　　　　　　　　　　235/492

\* cited by examiner

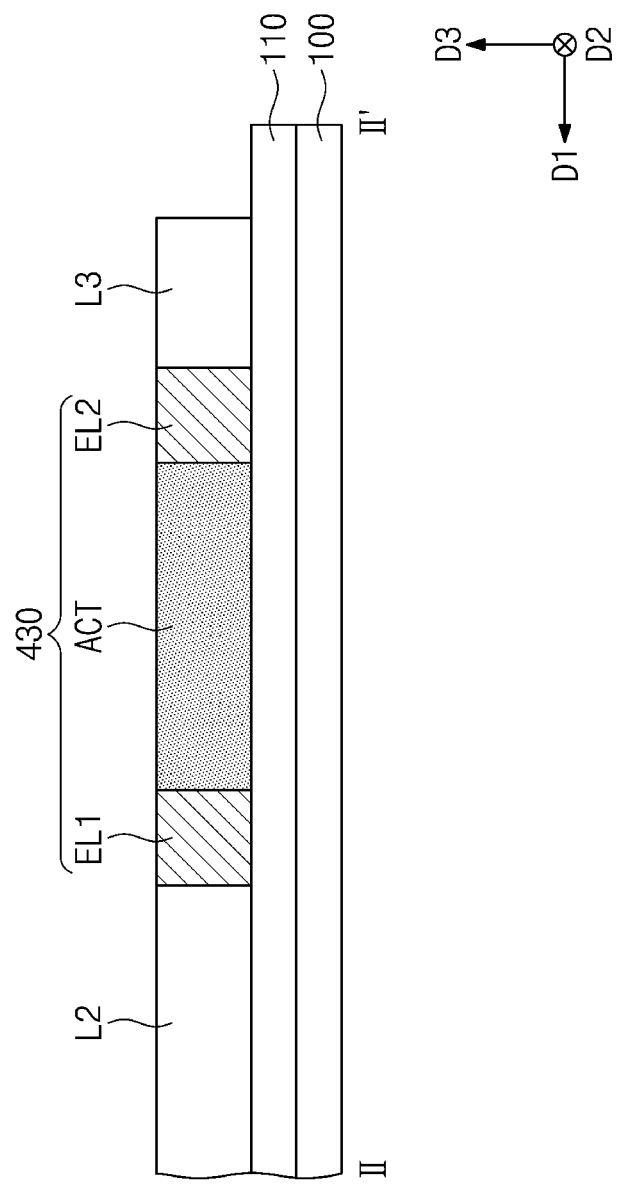

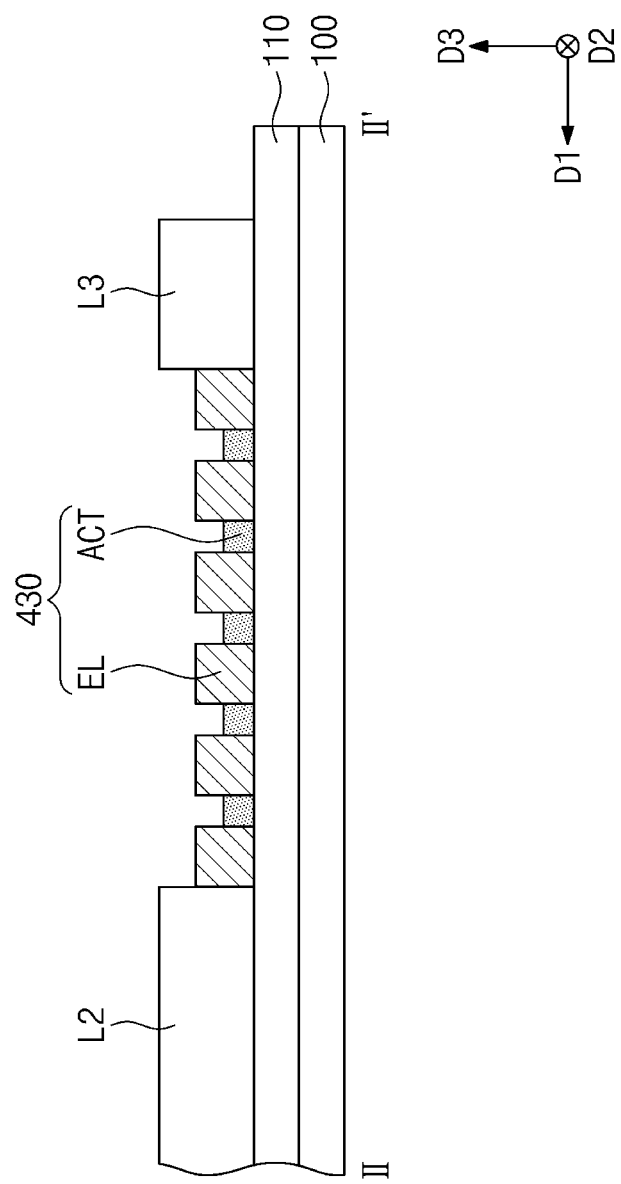

RADIO FREQUENCY IDENTIFICATION TAG AND MANUFACTURING METHOD THEREOF

CROSS-REFERENCE TO RELATED APPLICATIONS

This U.S. non-provisional patent application claims priority under 35 U.S.C. § 119 of Korean Patent Application Nos. 10-2019-0106011, filed on Aug. 28, 2019, and 10-2019-0163803, filed on Dec. 10, 2019, the entire contents of which are hereby incorporated by reference.

BACKGROUND

The present disclosure herein relates to a radio frequency identification tag and a manufacturing method thereof, and more particularly, to a radio frequency identification tag including a flexible element and a manufacturing method thereof.

Radio frequency identification (RFID) is a contactless recognition system that exchanges information using radio frequency between an RFID reader and an RFID tag. The RFID reader transmits a signal towards the RFID tag. The RFID tag receives a signal transmitted from the RFID reader. The RFID tag modulates the received signal and retransmits it to the RFID reader. The RFID reader performs a subsequent operation according to the modulated signal received from the RFID tag.

RFID is divided into an active RFID method and a passive RFID method. According to the active RFID method, the RFID tag has a power source. RFID tags operate using a built-in power source. According to the passive RFID method, the RFID tag does not have a separate power source. The RFID reader provides energy to the RFID tag in a contactless manner. The RFID tag operates using energy supplied from an RFID reader.

The passive RFID method includes a mutual induction method and an electromagnetic wave method. The mutual induction method is a technique mainly used in low frequency RFID. According to the mutual induction method, the RFID reader transmits energy in the form of a magnetic field to the RFID tag. According to the electromagnetic wave method, the RFID reader transmits energy in the form of electromagnetic waves to the RFID tag.

SUMMARY

The present disclosure provides a disposable radio frequency identification tag with low complexity.

The present disclosure also provides a method of manufacturing a radio frequency identification tag more easily through a printing process.

An embodiment of the inventive concept provides a radio frequency identification tag including: a substrate; an antenna unit provided on the substrate and configured to transmit and receive signals; an integrated circuit unit spaced apart from the antenna unit on the substrate; and an interrupter and a delay circuit unit connected in parallel between the antenna unit and the integrated circuit unit, wherein the interrupter includes a variable portion and a fixed portion opposite the variable portion, wherein the delay circuit unit includes a capacitor and a resistor.

In an embodiment, the interrupter may include at least one of polydimethylsiloxane (PDMS), polyurethane (PU), polystyrene, silver nanowire (Ag nanowire), carbon nanotube (CNT), and metal nanoparticles.

In an embodiment, the radio frequency identification tag may further include: a first conductive line connected to the antenna unit; a second conductive line connected to the first conductive line and the delay circuit unit; a third conductive line connected between the capacitor and the resistor of the delay circuit unit; a fourth conductive line connected to the delay circuit unit and spaced apart from the second conductive line; and a fifth conductive line connected to the fourth conductive line and the integrated circuit unit.

In an embodiment, the interrupter may be configured to be transformed by heating, wherein the fixed portion of the interrupter may be connected to the second conductive line or the fourth conductive line.

In an embodiment, the substrate may include a recess area provided at a position vertically overlapping the interrupter.

In an embodiment, the radio frequency identification tag may further include an insulating layer covering an upper surface of the substrate.

In an embodiment, the delay circuit unit may further include a varistor connected to the capacitor or the resistor, wherein the varistor may include at least two electrodes and an active layer between the at least two electrodes.

In an embodiment, the capacitor of the delay circuit unit may include a lower electrode, a dielectric layer, and an upper electrode sequentially stacked on the substrate, wherein the dielectric layer may include at least one of ceramic, epoxy, and polyimide.

In an embodiment, the integrated circuit unit may include a state detection unit and a semiconductor chip, wherein the state detection unit may include at least one sensor.

In an embodiment, the state detection unit may include a capacitor-type sensor, wherein the integrated circuit unit may further include a reference capacitor connected in parallel with the state detection unit.

In an embodiment of the inventive concept, a radio frequency identification tag includes: a substrate; an antenna unit provided on the substrate and configured to transmit and receive signals; an integrated circuit unit spaced apart from the antenna unit on the substrate; and an interrupter and a delay circuit unit connected in parallel between the antenna unit and the integrated circuit unit, wherein the interrupter includes a variable portion and a fixed portion opposite the variable portion, wherein the delay circuit unit includes at least two electrodes and an active layer between the at least two electrodes.

In an embodiment, the delay circuit unit may include three or more electrodes, wherein the electrodes may be spaced apart from each other, wherein the active layer may be provided in plural, wherein upper surfaces of the active layers may have a lower level than upper surfaces of the electrodes.

In an embodiment, a width of each of the electrodes may be 100 µm to 500 µm, wherein a distance between each of the electrodes may be 30 µm to 100 µm, wherein a thickness of each of the active layers may be 20 µm to 40 µm.

In an embodiment, the active layer may include at least one of silicon carbide (SiC), zinc oxide (ZnO), silver nanoparticles, nickel nanoparticles, and nickel (Ni)-lithium (Li) oxide.

In an embodiment of the inventive concept, a method of manufacturing a radio frequency identification tag includes: forming an insulating layer on a substrate; printing an antenna unit, an integrated circuit unit, an interrupter and a delay circuit unit on the insulating layer; and printing the wiring connecting the antenna unit, the integrated circuit unit, the interrupter and the delay circuit unit to each other, wherein the delay circuit unit includes a capacitor and a resistor, wherein the interrupter and the delay circuit unit are connected in parallel between the antenna unit and the integrated circuit unit.

In an embodiment, the method may further include patterning a portion of the insulating layer to form a recess area, wherein the interrupter may be provided on the recess area.

In an embodiment, printing the antenna unit, the integrated circuit unit, the interrupter, and the delay circuit unit on the insulating layer, and printing wirings connecting the antenna unit, the integrated circuit unit, the interrupter and the delay circuit unit to each other may be performed by a screen printing process.

In an embodiment, the interrupter may include a conductive shape memory polymer, wherein the interrupter may be formed through assigning a first shape by processing at a high temperature, transforming to a second shape at a low temperature, and recovering the first shape by heating to a high temperature again.

In an embodiment, the interrupter may include at least one of polydimethylsiloxane (PDMS), polyurethane (PU), polystyrene, silver nanowire (Ag nanowire), carbon nanotube (CNT), and metal nanoparticles.

In an embodiment, the delay circuit unit may further include a varistor connected to the capacitor or the resistor, wherein the varistor may include at least two electrodes and an active layer between the at least two electrodes.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 6B and 7B are cross-sectional views for explaining a device of a radio frequency identification tag according to other embodiments of the inventive concept, and correspond to a cross-section of FIGS. 6A and 7A taken along line respectively.

DETAILED DESCRIPTION

Figure 1:
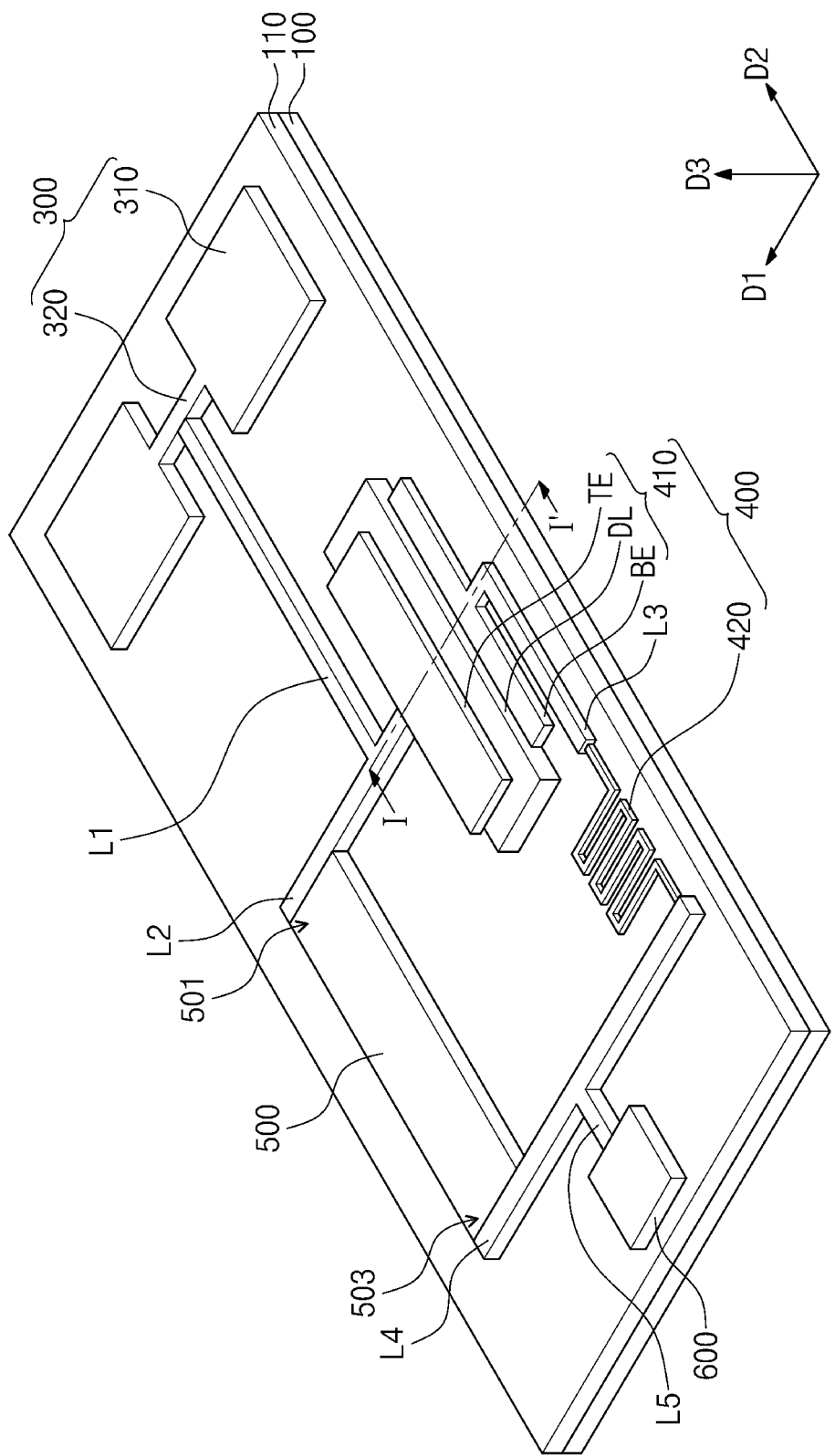
FIG. 1 is a perspective view for explaining a radio frequency identification tag according to embodiments of the inventive concept.

In order to fully understand the configuration and effects of the technical spirit of the inventive concept, preferred embodiments of the technical spirit of the inventive concept will be described with reference to the accompanying drawings.

However, the technical spirit of the inventive concept is not limited to the embodiments set forth herein and may be implemented in various forms and various modifications may be applied thereto. Only, the technical spirit of the inventive concept is disclosed to the full through the description of the embodiments, and it is provided to those skilled in the art that the inventive concept belongs to inform the scope of the inventive concept completely. In the accompanying drawings, for convenience of explanation, the components are enlarged in size than the actual size, and the proportions of each component can be exaggerated or reduced.

The terms used in this specification are used only for explaining specific embodiments while not limiting the inventive concept. Unless otherwise the terms used in embodiments of the inventive concept are defined differently, they may be interpreted as commonly known to those skilled in the art.

The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Where a layer is referred to herein as 'on' another layer, it may be formed directly on the upper surface of the other layer or with a third layer interposed therebetween.

It will be understood that the terms "first", "second", and "third" are used herein to describe various regions, films (or layers), and so on, but these regions, films (or layers), and so on should not be limited by these terms. These terms are only used to distinguish any given region or layer from other regions or layers. Thus, the portion referred to as the first portion in one embodiment may be referred to as the second portion in other embodiments. Embodiments described herein include complementary embodiments thereof. Like reference numerals refer to like components throughout the specification.

Hereinafter, a radio frequency identification tag and a method of manufacturing the same according to embodiments of the inventive concept will be described in detail with reference to the drawings.

Figure 2:
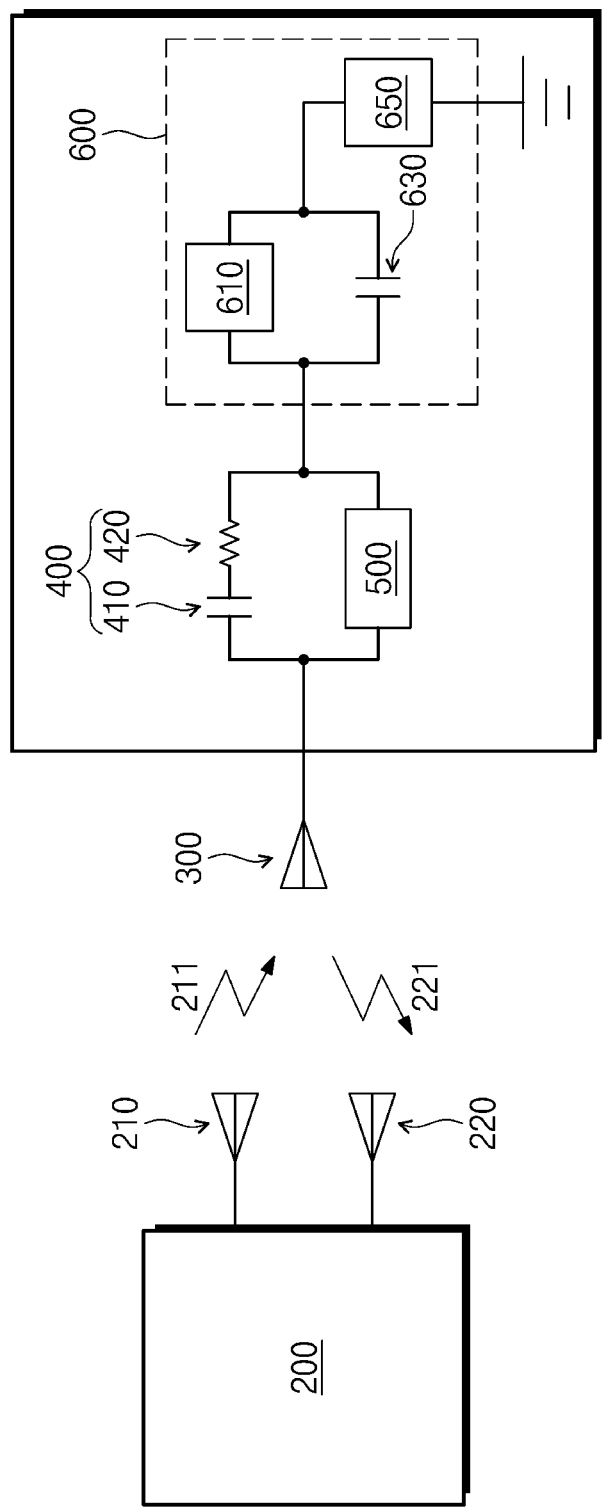
FIG. 2 is a circuit diagram for explaining a radio frequency identification tag according to embodiments of the inventive concept.

FIG. 1 is a perspective view for explaining a radio frequency identification tag according to embodiments of the inventive concept. FIG. 2 is a circuit diagram for explaining a radio frequency identification tag according to embodiments of the inventive concept.

Referring to FIGS. 1 and 2, the radio frequency identification tag according to embodiments of the inventive concept may include a substrate 100, an insulating layer 110, an antenna unit 300, a delay circuit unit 400, an interrupter 500, and an integrated circuit unit 600.

The substrate 100 and the insulating layer 110 may have a flat plate shape extending in the first direction D1 and the second direction D2. The second direction D2 may be a direction perpendicular to the first direction D1. For example, each of the substrate 100 and the insulating layer 110 may have a length extending in the first direction D1, which is smaller than a length extending in the second direction D2. The substrate 100 may include, for example, plastic, glass, paper, and the like. The substrate 100 may be, for example, a flexible substrate. The insulating layer 110 may cover the entire upper surface of the substrate 100. The insulating layer 110 may include an insulating material. However, when the insulating property of the substrate 100 is excellent unlike what is shown in the drawing, the insulating layer 110 may be omitted, and the antenna unit 300, the delay circuit unit 400, the interrupter 500, and the integrated circuit unit 600 may be provided on the upper surface of the substrate 100.

The antenna unit 300, the delay circuit unit 400, the interrupter 500, and the integrated circuit unit 600 may be provided on the upper surface of the insulating layer 110. Each of the antenna unit 300, the delay circuit unit 400, the interrupter 500, and the integrated circuit unit 600 may be in the form of a flat plate or a line.

The antenna unit 300 may include two first portions 310 and a second portion 320 connecting the first portions 310. The first portions 310 may be provided symmetrically with the second portion 320 interposed therebetween. The second portion 320 may be in the form of a line extending in the first direction D1 between the first portions 310. A width of each of the first portions 310 in the first direction D1 may be greater than a width of the second portion 320 in the first direction D1. The width of each of the first portions 310 in the second direction D2 may be greater than the width of the second portion 320 in the second direction D2.

Referring to FIG. 2, the antenna unit 300 may exchange signals with a transmission antenna 210 or a reception antenna 220 of the reader 200. The antenna unit 300 may transmit the RF signal transmitted from the transmission antenna 210 of the reader 200 to elements inside the radio frequency identification tag. In addition, the antenna unit 300 may transmit information of elements inside the radio frequency identification tag to the reception antenna 220 of the reader 200 in the form of an RF signal. That is, the radio frequency identification tag according to embodiments of the inventive concept can be used for security and authentication purposes such as identification, and information such as temperature and humidity measured inside the radio frequency identification tag may be delivered to the outside.

The delay circuit unit 400 may include a capacitor 410 and a resistor 420. The capacitor 410 may be connected to the second portion 320 of the antenna unit 300 through the first conductive line L1 and the second conductive line L2. The capacitor 410 may be connected to the interrupter 500 through the second conductive line L2. The capacitor 410 may be connected to the resistor 420 through the third conductive line L3. The resistor 420 may be connected to the interrupter 500 through the fourth conductive line L4. In addition, the resistor 420 may be connected to the integrated circuit unit 600 through the fourth conductive line L4 and the fifth conductive line L5. The delay circuit unit 400 and the interrupter 500 may be connected in parallel to each other through the second conductive line L2 and the fourth conductive line L4. The first conductive line L1, the third conductive line L3, and the fifth conductive line L5 may extend in the second direction D2, and the second conductive line L2 and the fourth conductive line L4 may extend in the first direction D1. The first to fifth conductive lines L1 to L5 may include a conductive material. For example, the first to fifth conductive lines L1-L5 may include silver (Ag).

The capacitor 410 of the delay circuit unit 400 may include a lower electrode BE, a dielectric layer DL, and an upper electrode TE sequentially formed on the upper surface of the insulating layer 110. The structure of the capacitor 410 will be described later in detail with reference to FIG. 3. The resistor 420 of the delay circuit unit 400 may include portions extending in the first direction D1 and portions extending in the second direction D2. The resistor 420 of the delay circuit unit 400 may include portions extending in the first direction D1 and portions extending in the second direction D2. For example, a thickness of each portion of the resistor 420 in the third direction D3 may be smaller than a thickness of the third conductive line L3 in the third direction D3 and a thickness of the fourth conductive line L4 in the third direction D3.

The delay circuit unit 400 may modulate the RF signal applied to the antenna unit 300. Specifically, the delay circuit unit 400 may modulate the RF signal through impedance change. In addition, the delay circuit unit 400 may control the rate of voltage rise (dV/dt) as the interrupter 500 is electrically shorted. That is, the delay circuit unit 400 may block an abnormal voltage that may occur during the operation of the interrupter 500 and protect the internal circuit.

The interrupter 500 may include a variable portion 501 on one side and a fixed portion 503 opposite to the variable portion 501. The variable portion 501 may be connected to the capacitor 410 through the second conductive line L2, and the fixed portion 503 may be connected to the resistor 420 through the fourth conductive line L4. However, this is only exemplary and the inventive concept is not limited thereto. Unlike what is shown in the drawing, the variable portion 501 may be connected to the capacitor 410 through the fourth conductive line L4, and the fixed portion 503 may be connected to the resistor 420 through the second conductive line L2. The interrupter 500 may include, for example, an elastic conductive material, an inorganic metal electrode material, or a shape memory polymer (SMP).

When the interrupter 500 includes a stretchable conductive material, as the length of the object equipped with the entire radio frequency identification tag increases, the length of the interrupter 500 increases so that after the threshold is exceeded, a short circuit may occur automatically. The object to which the radio frequency identification tag is mounted may be a growth site (e.g., leaf or stem) of a plant that is growing in length. The stretchable conductive material, for example, may include a mixture of polymers such as polydimethylsiloxane (PDMS), polyurethane (PU), and the like and conductive nanomaterials such as silver nanowires (Ag nanowire), carbon nanotubes (CNT), metal nanoparticles, and the like.

When the interrupter 500 includes an inorganic metal electrode material, the substrate 100 and the insulating layer 110 may be flexible substrates. At this time, the interrupter 500, for example, may have a wavy structure, such as an accordion. When the deformation of the substrate 100 and the insulating layer 110 reaches a threshold value, the interrupter 500 may be disconnected, thereby stopping the operation of the radio frequency identification tag.

When the interrupter 500 includes a shape memory polymer, the interrupter 500 may be formed through assigning a permanent shape by processing it at high temperature, deforming it to any desired shape at a low temperature, and restoring the original permanent shape by heating it to high temperature again. The shape memory polymer may have a unidirectional shape memory effect or a reversible bidirectional shape memory effect. Shape memory polymer, for example, may include polystyrene. The shape memory polymer has a low density and large tensile force compared to a shape memory alloy, and can be easily manufactured at low cost. In addition, the shape memory polymer may have a greater tensile strength than shape memory alloy, shape memory ceramic or glass. For example, when a radio frequency identification tag is used to manage the growth and growth stage of agricultural and livestock products in a greenhouse, after the period of use, it is necessary to stop the operation of the radio frequency identification tag. When the interrupter 500 includes a shape memory polymer, the interrupter 500 may not stop operations of a plurality of radio frequency identification tags one by one, and stop the operations in a batch by raising the temperature inside the greenhouse. When the interrupter 500 includes a shape memory polymer, the specific operations of the variable portion 501 and the fixed portion 503 of the interrupter 500 will be described later in detail with reference to FIG. 5.

The integrated circuit unit 600 may be connected to the fourth conductive line L4 through the fifth conductive line L5, and may be connected to the delay circuit unit 400 and the interrupter 500 through the fourth conductive line L4. Referring to FIG. 2, the integrated circuit unit 600 may include a state detection unit 610, a reference capacitor 630 connected in parallel with the state detection unit 610, and a semiconductor chip 650 connected to the state detection unit 610 and the reference capacitor 630. The state detection unit 610 may include at least one sensor. The state detection unit 610 may include at least one sensor. For example, the state detection unit 610 may include a temperature sensor and/or a humidity sensor. The reference capacitor 630 may correct a change in capacitance of the state detection unit 610. The semiconductor chip 650 may be grounded at one side.

Information sensed by the state detection unit 610 of the integrated circuit unit 600 may be transmitted to the delay circuit unit 400 and the interrupter 500. Accordingly, under certain conditions, the interrupter 500 can be transformed into a temporary idle state or a permanent stop state. However, when a specific condition is not satisfied, the interrupter 500 may be substantially the same as a general conductive line. The radio frequency identification tag according to the inventive concept can stop the operation through the delay circuit unit 400, the interrupter 500 and the integrated circuit unit 600 without the use of a separate electrical manipulation or energy device when the use is finished.

Figure 3:
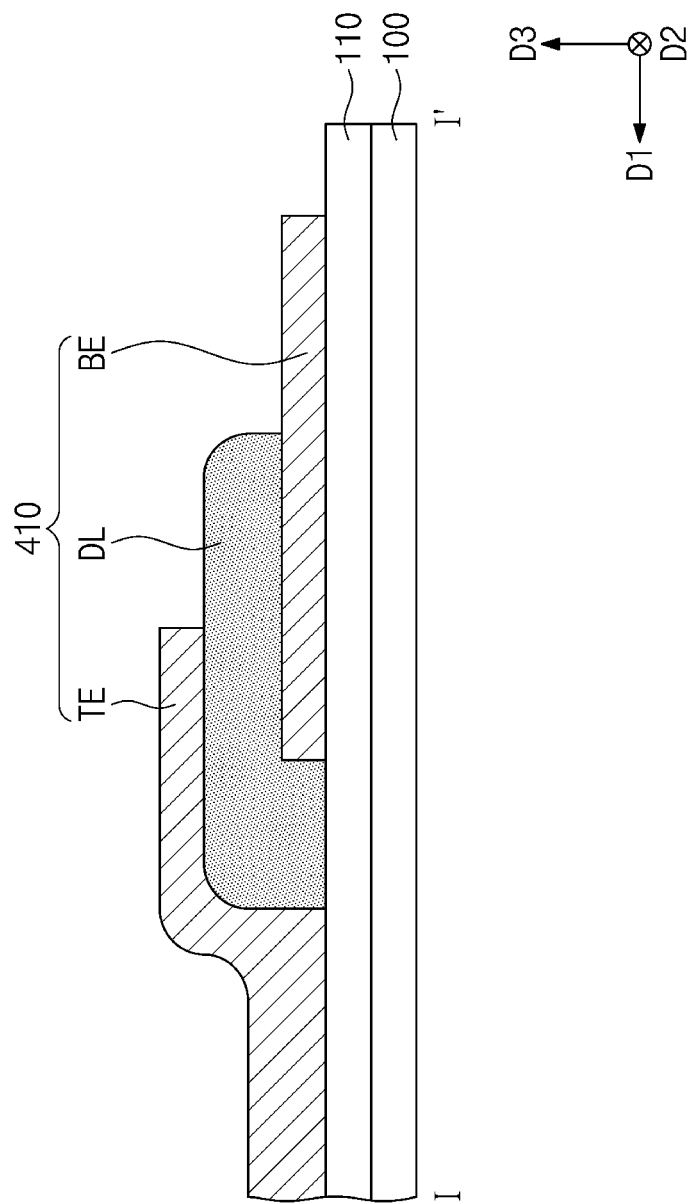
FIG. 3 is a cross-sectional view for explaining a device of a radio frequency identification tag according to embodiments of the inventive concept, and corresponds to a cross-section of FIG. 1 taken along line I-I'.

FIG. 3 is a cross-sectional view for explaining a device of a radio frequency identification tag according to embodiments of the inventive concept, and corresponds to a cross-section of FIG. 1 taken along line I-I'.

Referring to FIGS. 1 and 3, the capacitor 410 may include a lower electrode BE, a dielectric layer DL, and an upper electrode TE formed sequentially on the upper surface of the insulating layer 110. The lower electrode BE may be in the form of a plate. The lower surface of the lower electrode BE may contact the upper surface of the insulating layer 110. The dielectric layer DL may cover a portion of the upper surface of the lower electrode BE. That is, a portion of the upper surface of the lower electrode BE may overlap the dielectric layer DL in the third direction D3. In addition, other portions of the upper surface of the lower electrode BE may not overlap the dielectric layer DL and may be exposed to the outside. The length of the dielectric layer DL in the second direction D2 may be greater than the length of each of the lower electrode BE and the upper electrode TE in the second direction D2. The upper electrode TE may cover a portion of the upper surface of the dielectric layer DL. A portion of the upper electrode TE may overlap the lower electrode BE in the third direction D3 with the dielectric layer DL therebetween. That is, a portion of the dielectric layer DL may overlap the lower electrode BE and the upper electrode TE in the third direction D3. The upper electrode TE may be connected to the second conductive line L2, and the lower electrode BE may be connected to the resistor 420 through the third conductive line L3.

The lower electrode BE and the upper electrode TE may include a conductive material. For example, the lower electrode BE and the upper electrode TE may include silver (Ag) or copper (Cu). The dielectric layer DL may include an insulating material. The dielectric layer DL may include, for example, ceramic or a ceramic filled photo-dielectric resin. The ceramic-filled photo-dielectric resin may be, for example, a composite of a thermosetting plastic, an epoxy or polyimide, and a ceramic powder. When the dielectric layer DL includes a ceramic filled photo-dielectric resin having a thickness of about 10 μm, the capacitance per unit area may be about 5 $nF/cm^2$ to about 7 $nF/cm^2$.

The manufacturing method of the capacitor 410 may include printing a conductive material to form a lower electrode BE, printing an insulating material to form a dielectric layer DL, and printing a conductive material to form an upper electrode TE. The manufacturing method of the capacitor 410 may further include drying the printed material between each printing operation. Each printing operation, for example, may be performed by a screen printing process.

Figure 4:
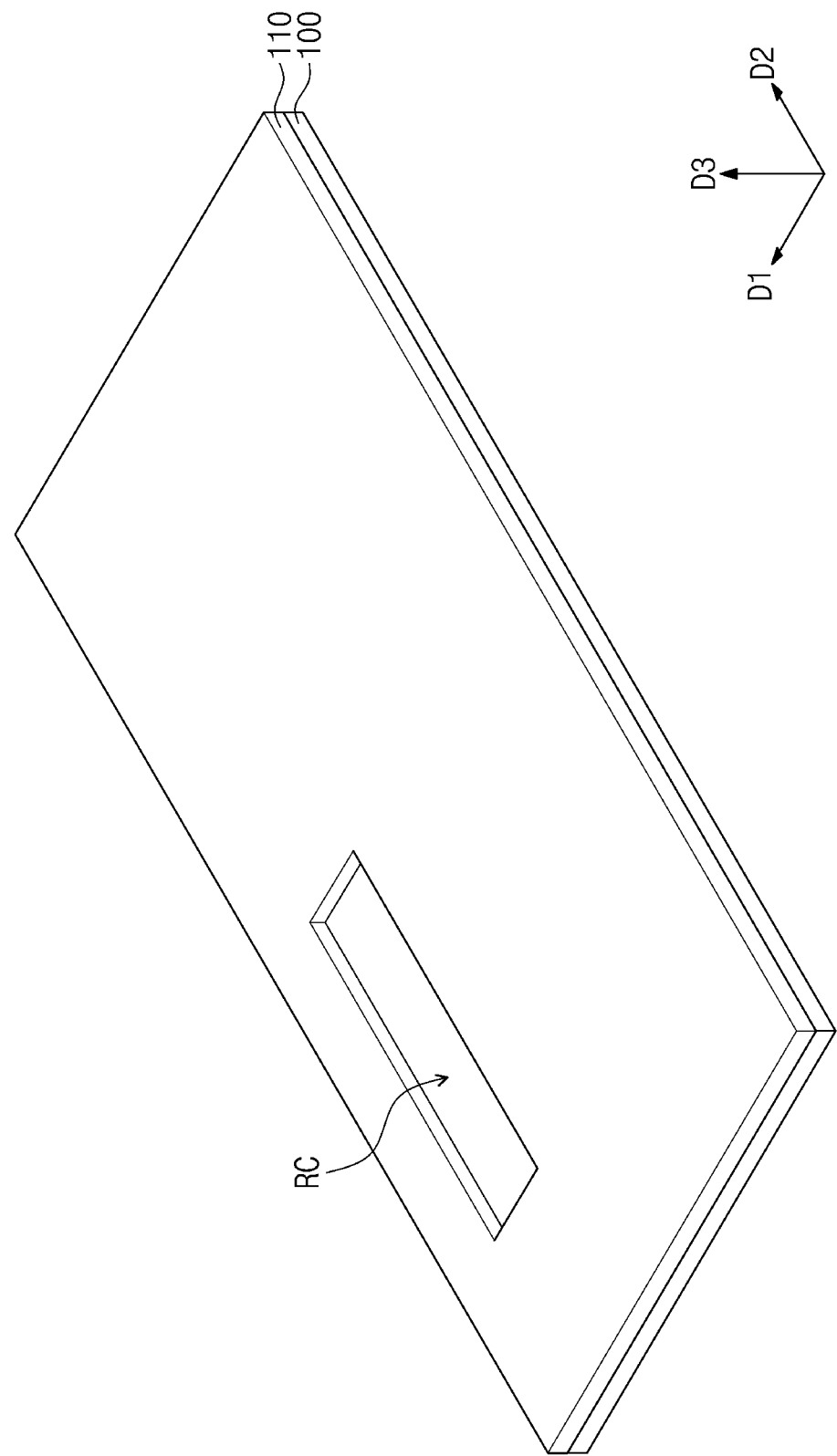
FIG. 4 is a perspective view illustrating a method of manufacturing a radio frequency identification tag according to embodiments of the inventive concept.

FIG. 4 is a perspective view illustrating a method of manufacturing a radio frequency identification tag according to embodiments of the inventive concept.

Referring to FIG. 4, a method of manufacturing a radio frequency identification tag according to embodiments of the inventive concept may include preparing a substrate 100, forming an insulating layer 110 on the substrate 100, and patterning a portion of the insulating layer 110 to form a recess area RC.

The bottom surface of the recess area RC may have a lower level than the upper surface of the insulating layer 110. Also, a portion of the substrate 100 may be patterned in the process of patterning a portion of the insulating layer 110. At this time, the bottom surface of the recess area RC may have a lower level than the upper surface of the substrate 100. The recess area RC may define an area where an interrupter 500 (see FIG. 1) will be provided.

Referring back to FIG. 1, a method of manufacturing a radio frequency identification tag according to embodiments of the inventive concept may include a first printing operation of forming the antenna unit 300, the delay circuit unit 400, the interrupter 500 and the integrated circuit unit 600 in a printing process, after the forming of the recess area RC, and a second printing operation of forming the first to fifth conductive lines L1 to L5 connecting the antenna unit 300, the delay circuit unit 400, the interrupter 500, and the integrated circuit unit 600 to each other. The first printing operation and the second printing operation may be performed simultaneously or irrespective of the order. The first printing operation and the second printing operation may be performed by, for example, a screen printing process. The method of forming the capacitor 410 of the delay circuit unit 400 may be as described above with reference to FIG. 3. The method of forming the resistor 420 of the delay circuit unit 400 may include printing conductive materials to form portions extending in the first direction D1 and portions extending in the second direction D2; and drying the printed material. When the portions extending in the first direction D1 and the portions extending in the second direction D2 are simultaneously formed, it is possible to prevent electric parasitic components from being induced at the connection portions of the respective portions. The conductive material forming the resistor 420 may include, for example, a metal such as silver (Ag) or copper (Cu), a conductive polymer, or a carbon material such as carbon nanotube (CNT). When the resistor 420 is formed of a composite material including a variety of different materials, connection lengths of portions extending in the first direction D1 and portions extending in the second direction D2 may be reduced, such that accordingly, it is possible to prevent electrical parasitic components from being induced at the connection portions of the respective portions.

Figure 5:
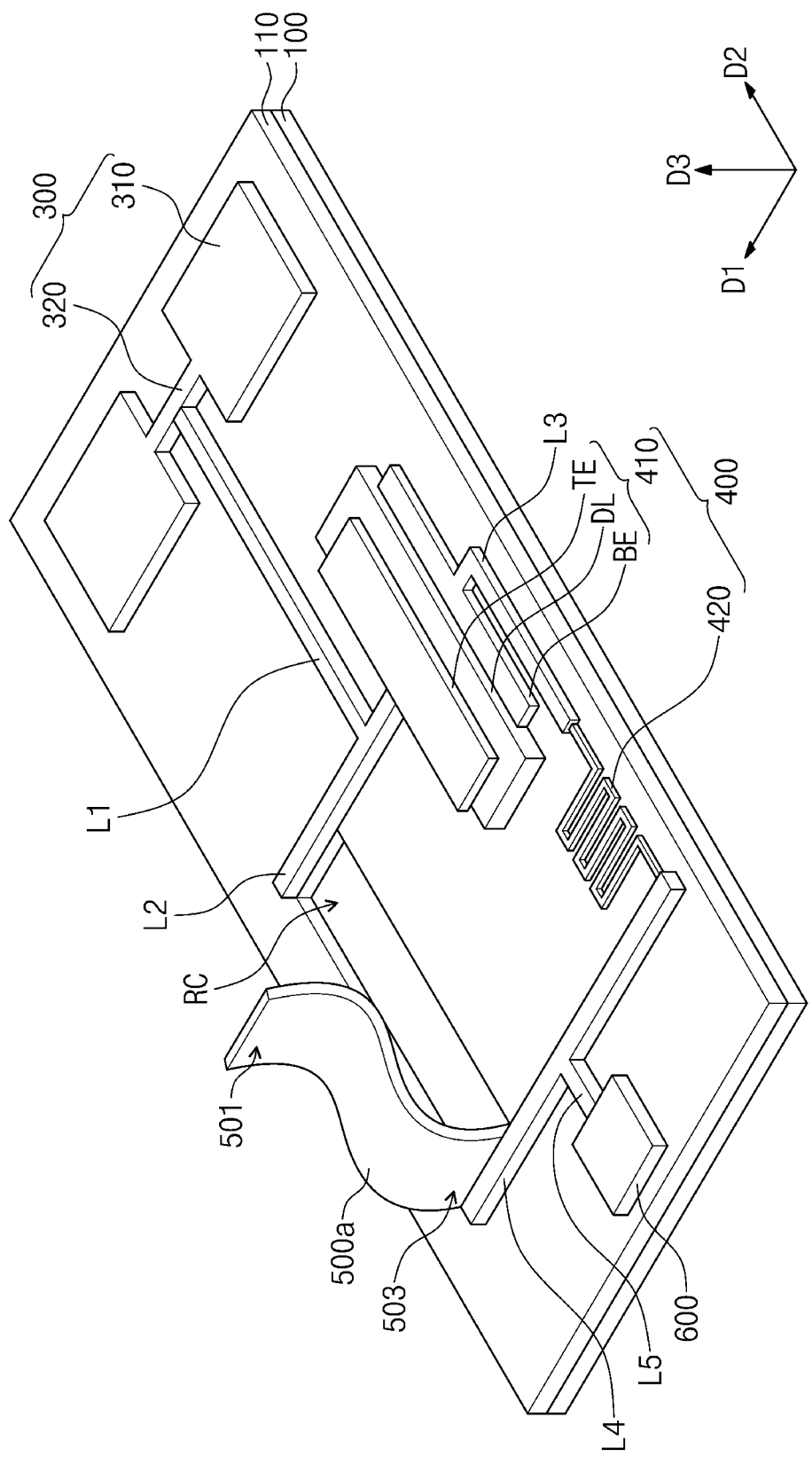
FIG. 5 is a perspective view for explaining the operation of a radio frequency identification tag according to embodiments of the inventive concept.

FIG. 5 is a perspective view for explaining the operation of a radio frequency identification tag according to embodiments of the inventive concept. Specifically, FIG. 5 shows a case where the interrupter 500a including the shape memory polymer is electrically shorted.

Referring to FIG. 5, the interrupter 500a may include a conductive shape memory polymer. The variable portion 501 of the interrupter 500a may be spaced apart from the second conductive line L2. The fixed portion 503 of the interrupter 500a may contact the fourth conductive line L4. The upper and lower surfaces of the interrupter 500a may be curved surfaces. However, this is only an example, and the interrupter 500a may be modified in various shapes. Due to the modification of the interrupter 500a, the recess area RC under the interrupter 500a may be exposed to the outside. Due to the modification of the interrupter 500a, the operation of the radio frequency identification tag can be stopped. As an example, the radio frequency identification tag can be reused by restoring the interrupter 500a having a modified shape to a state before modification.

Figure 6A:
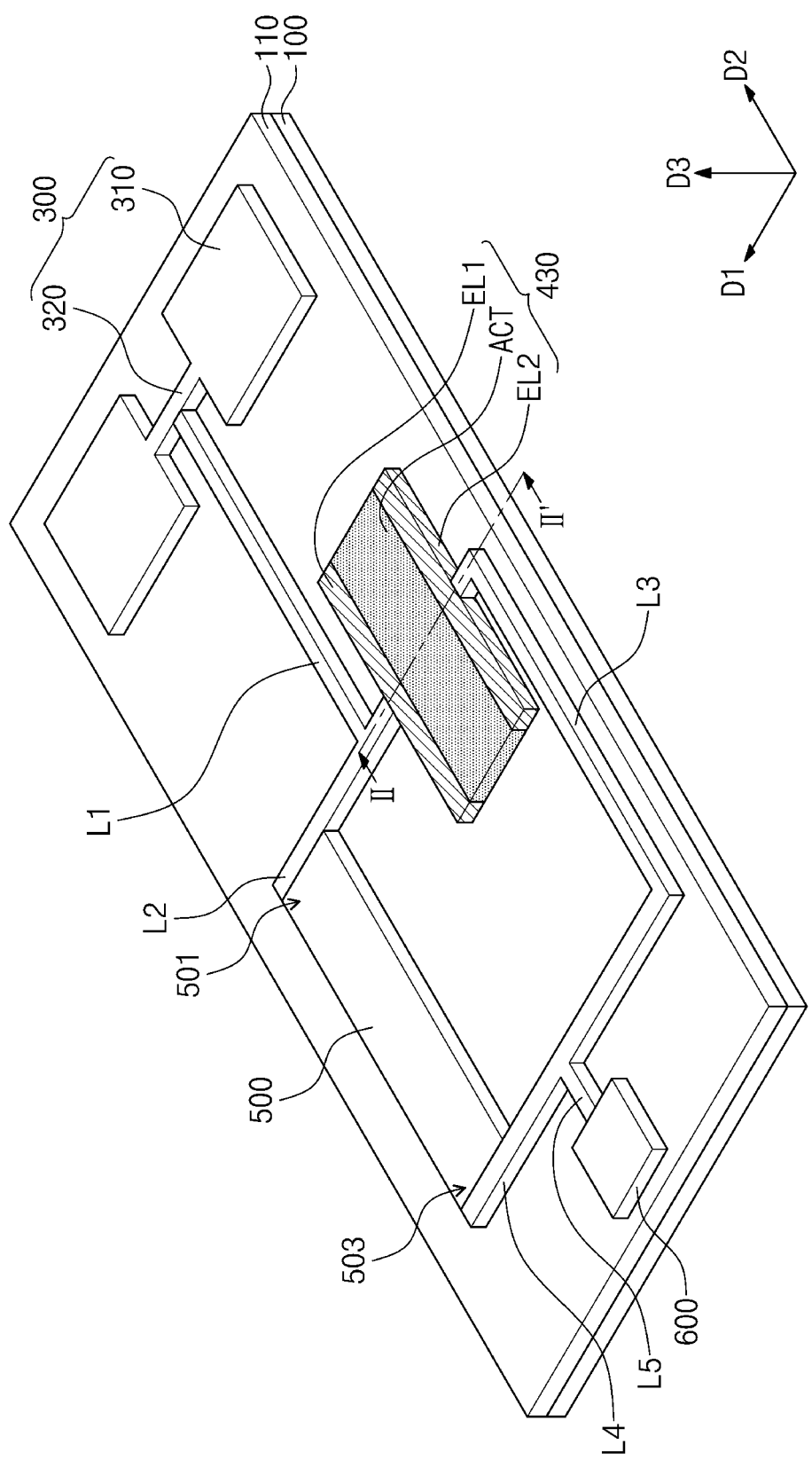
FIGS. 6A and 7A are perspective views illustrating a radio frequency identification tag according to other embodiments of the inventive concept.

FIG. 6A is a perspective view illustrating a radio frequency identification tag according to other embodiments of the inventive concept. FIG. 6B is a cross-sectional view for explaining a device of a radio frequency identification tag according to other embodiments of the inventive concept, and corresponds to a cross-section of FIG. 6A taken along line II-IP. Hereinafter, contents overlapping with those described with reference to FIGS. 1 to 5 will be omitted.

Referring to FIGS. 6A and 6B, the delay circuit unit 400 of the radio frequency identification tag may include a varistor 430 instead of the capacitor 410 (see FIG. 2) and the resistor 420 (see FIG. 2). The varistor 430 may be connected to the antenna unit 300 through the first conductive line L1 and the second conductive line L2. The varistor 430 may be connected to the interrupter 500 through the second conductive line L2. The varistor 430 may be connected to the integrated circuit unit 600 through the third conductive line L3, the fourth conductive line L4, and the fifth conductive line L5. The varistor 430 may include a first electrode ELL an active layer ACT, and a second electrode EL2. The first electrode EL1 may contact the second conductive line L2. The second electrode EL2 may contact the third conductive line L3. The active layer ACT may be in the form of a flat plate extending in the first direction D1 and the second direction D2 between the first electrode EL1 and the second electrode EL2. For example, the upper surfaces of the active layer ACT may be positioned at substantially the same level as the upper surfaces of the first electrode EL1 and the second electrode EL2. The first electrode EL1 and the second electrode EL2 may include a conductive material. For example, the first electrode EL1 and the second electrode EL2 may include substantially the same material as the first to fifth conductive lines L1-L5. The active layer ACT may include, for example, silicon carbide (SiC), zinc oxide (ZnO), silver nanoparticles (Ag nanoparticle), nickel nanoparticles (Ni nanoparticle), nickel (Ni)-lithium (Li) oxide, and the like. For example, the active layer ACT may include zinc oxide (ZnO) in powder form. Further, the active layer ACT may be in the form of an ink further including an organic solvent. More specifically, the active layer ACT may be manufactured through applying a solution in the form of an ink and removing a solvent through heat treatment. The varistor 430 can be easily manufactured through heat treatment after printing without a soldering process. Meanwhile, unlike what is shown in the drawing, the delay circuit unit 400 (see FIG. 2) of the radio frequency identification tag according to the inventive concept may include a varistor 430 connected in series or parallel to the capacitor 410 (see FIG. 2) and the resistor 420 (see FIG. 2). The RC delay circuit may be easily operated in a low frequency band, and the varistor 430 may be easily operated in a high voltage or high current environment. That is, the radio frequency identification tag including the RC delay circuit and the varistor 430 may operate in various environments.

Figure 7A:
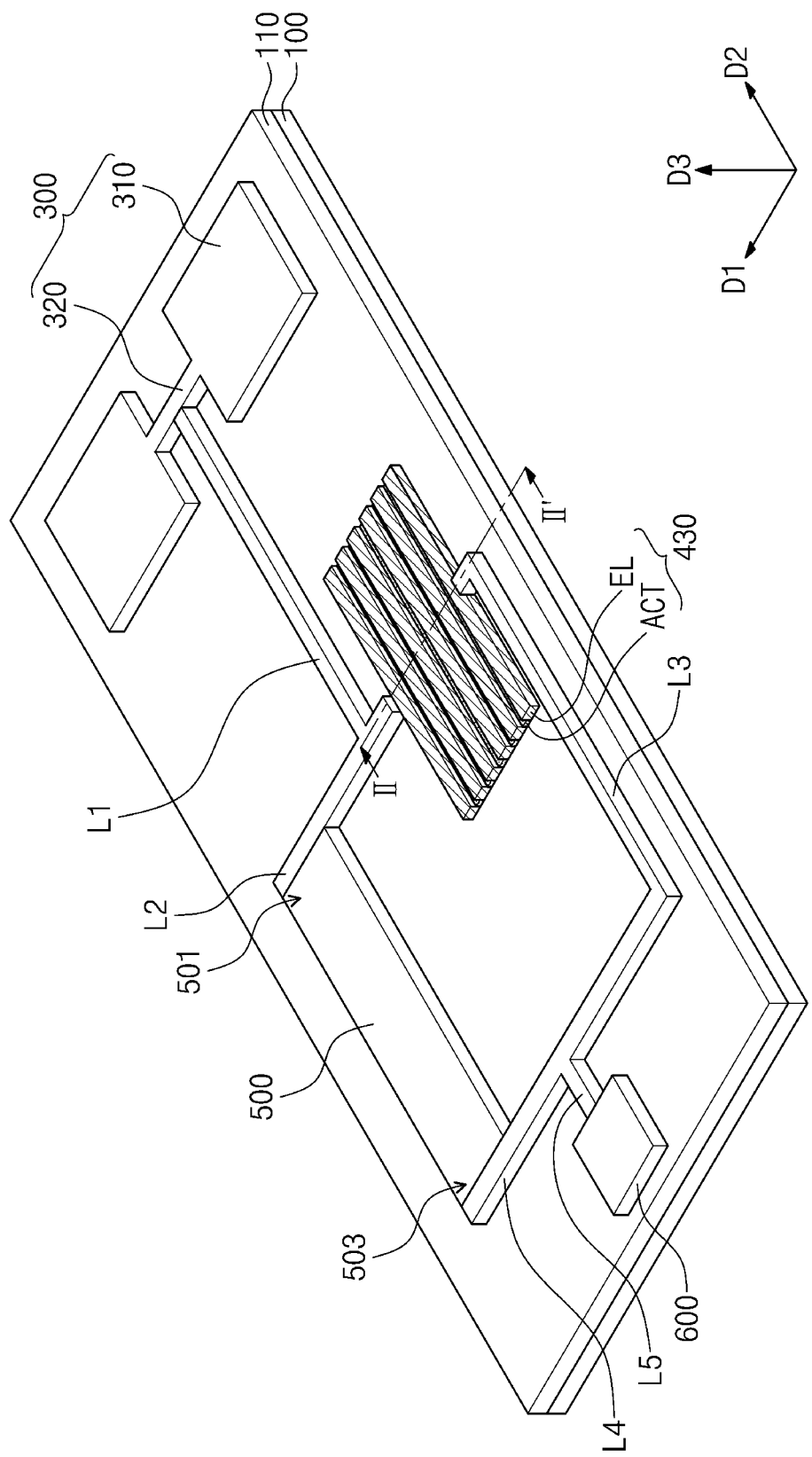

FIG. 7A is a perspective view illustrating a radio frequency identification tag according to other embodiments of the inventive concept. FIG. 7B is a cross-sectional view for explaining a device of a radio frequency identification tag according to other embodiments of the inventive concept, and corresponds to a cross-section of FIG. 7A taken along line II-IP. Hereinafter, contents overlapping with those described with reference to FIGS. 1 to 5 and FIGS. 6A and 6B will be omitted.

Referring to FIGS. 7A and 7B, the varistor 430 may include a plurality of electrodes EL and active layers ACT between the plurality of electrodes EL. Three or more electrodes EL may be provided between the second conductive line L2 and the third conductive line L3. The electrodes EL may have a line shape extending in the second direction D2. The electrodes EL may be spaced apart from each other in the first direction D1. At least one of the electrodes EL may contact the second conductive line L2, and at least another of the electrodes EL may contact the third conductive line L3. A thickness of the active layer ACT in the third direction D3 may be about 20 µm to about 40 µm. A width of each of the electrodes EL in the first direction D1 may be about 100 µm to about 500 µm. A distance between the electrodes EL in the first direction D1 may be about 30 to 100 µm. For example, the upper surface of the electrodes EL may be positioned at a lower level than the upper surface of the second conductive line L2 and the third conductive line L3. For example, the upper surface of the active layers ACT may be positioned at a lower level than the upper surface of the electrodes EL. However, unlike what is shown in the drawing, the upper surfaces of the active layers ACT may be positioned at substantially the same level as the upper surfaces of the electrodes EL. Also, unlike what is shown in the drawing, the upper surfaces of the electrodes EL may be positioned at substantially the same level as the upper surfaces of the second conductive line L2 and the third conductive line L3. Also, unlike what is shown in the drawing, a single active layer ACT may be provided on the insulating layer 110. The single active layer ACT may be in the form of a flat plate extending in the first direction D1 and the second direction D2 between the second conductive line L2 and the third conductive line L3. In this case, the plurality of electrodes EL may be provided on the single active layer ACT.

The radio frequency identification tag according to an embodiment of the inventive concept may be stopped through a flexible element without additional electrical manipulation or energy element assistance, when the use is over.

In addition, the radio frequency identification tag according to an embodiment of the inventive concept can be easily manufactured at low cost through a printing process.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A radio frequency identification tag comprising:
    a substrate;
    an antenna unit provided on the substrate and configured to transmit and receive signals;
    an integrated circuit unit spaced apart from the antenna unit on the substrate; and
    an interrupter and a delay circuit unit connected in parallel between the antenna unit and the integrated circuit unit,
    wherein the interrupter comprises a variable portion and a fixed portion opposite the variable portion,
    wherein the delay circuit unit comprises a capacitor and a resistor.

2. The radio frequency identification tag of claim 1, wherein the interrupter comprises at least one of polydimethylsiloxane (PDMS), polyurethane (PU), polystyrene, silver nanowire (Ag nanowire), carbon nanotube (CNT), and metal nanoparticles.

3. The radio frequency identification tag of claim 1, further comprising:
    a first conductive line connected to the antenna unit;
    a second conductive line connected to the first conductive line and the delay circuit unit;
    a third conductive line connected between the capacitor and the resistor of the delay circuit unit;
    a fourth conductive line connected to the delay circuit unit and spaced apart from the second conductive line; and
    a fifth conductive line connected to the fourth conductive line and the integrated circuit unit.

4. The radio frequency identification tag of claim 3, wherein the interrupter is configured to be transformed by heating,
    wherein the fixed portion of the interrupter is connected to the second conductive line or the fourth conductive line.

5. The radio frequency identification tag of claim 1, wherein the substrate comprises a recess area provided at a position vertically overlapping the interrupter.

6. The radio frequency identification tag of claim 1, further comprising an insulating layer covering an upper surface of the substrate.

7. The radio frequency identification tag of claim 1, wherein the delay circuit unit further comprises a varistor connected to the capacitor or the resistor,
    wherein the varistor comprises at least two electrodes and an active layer between the at least two electrodes.

8. The radio frequency identification tag of claim 1, wherein the capacitor of the delay circuit unit comprises a lower electrode, a dielectric layer, and an upper electrode sequentially stacked on the substrate,
    wherein the dielectric layer comprises at least one of ceramic, epoxy, and polyimide.

9. The radio frequency identification tag of claim 1, wherein the integrated circuit unit comprises a state detection unit and a semiconductor chip,
    wherein the state detection unit comprises at least one sensor.

10. The radio frequency identification tag of claim 9, wherein the state detection unit comprises a capacitor-type sensor,
    wherein the integrated circuit unit further comprises a reference capacitor connected in parallel with the state detection unit.

11. A radio frequency identification tag comprising:
    a substrate;
    an antenna unit provided on the substrate and configured to transmit and receive signals;
    an integrated circuit unit spaced apart from the antenna unit on the substrate; and
    an interrupter and a delay circuit unit connected in parallel between the antenna unit and the integrated circuit unit,
    wherein the interrupter comprises a variable portion and a fixed portion opposite the variable portion,
    wherein the delay circuit unit comprises at least two electrodes and an active layer between the at least two electrodes.

12. The radio frequency identification tag of claim 11, wherein the delay circuit unit comprises three or more electrodes,
    wherein the electrodes are spaced apart from each other,
    wherein the active layer is provided in plural,
    wherein upper surfaces of the active layers have a lower level than upper surfaces of the electrodes.

13. The radio frequency identification tag of claim 12, wherein a width of each of the electrodes is 100 μm to 500 μm,
    wherein a distance between each of the electrodes is 30 μm to 100 μm,
    wherein a thickness of each of the active layers is 20 μm to 40 μm.

14. The radio frequency identification tag of claim 11, wherein the active layer comprises at least one of silicon carbide (SiC), zinc oxide (ZnO), silver nanoparticles, nickel nanoparticles, and nickel (Ni)-lithium (Li) oxide.

15. A method of manufacturing a radio frequency identification tag, the method comprising:
    forming an insulating layer on a substrate;
    printing an antenna unit, an integrated circuit unit, an interrupter and a delay circuit unit on the insulating layer; and
    printing the wiring connecting the antenna unit, the integrated circuit unit, the interrupter and the delay circuit unit to each other,
    wherein the delay circuit unit comprises a capacitor and a resistor,
    wherein the interrupter and the delay circuit unit are connected in parallel between the antenna unit and the integrated circuit unit.

16. The method of claim 15, further comprising patterning a portion of the insulating layer to form a recess area,
    wherein the interrupter is provided on the recess area.

17. The method of claim 15, wherein printing the antenna unit, the integrated circuit unit, the interrupter, and the delay circuit unit on the insulating layer, and printing wirings connecting the antenna unit, the integrated circuit unit, the interrupter and the delay circuit unit to each other are performed by a screen printing process.

18. The method of claim 15, wherein the interrupter comprises a conductive shape memory polymer,
    wherein the interrupter is formed through assigning a first shape by processing at a high temperature, transforming to a second shape at a low temperature, and recovering the first shape by heating to a high temperature again.

19. The method of claim 15, wherein the interrupter comprises at least one of polydimethylsiloxane (PDMS), polyurethane (PU), polystyrene, silver nanowire (Ag nanowire), carbon nanotube (CNT), and metal nanoparticles.

20. The method of claim 15, wherein the delay circuit unit further comprises a varistor connected to the capacitor or the resistor, wherein the varistor comprises at least two electrodes and an active layer between the at least two electrodes.

* * * * *